United States Patent
Tachibana et al.

(10) Patent No.: US 6,270,879 B1
(45) Date of Patent: Aug. 7, 2001

(54) RELEASE MEMBER FOR USE IN PRODUCING A MULTI-LAYER PRINTED WIRING BOARD

(75) Inventors: Toshimitsu Tachibana; Kenji Sato; Mitsuo Iimura, all of Osaka (JP)

(73) Assignee: Nitto Denko Corporation, Ibaraki (JP)

(*) Notice: Subject to any disclaimer, the term of this patent is extended or adjusted under 35 U.S.C. 154(b) by 0 days.

(21) Appl. No.: 09/614,600

(22) Filed: Jul. 12, 2000

(30) Foreign Application Priority Data

Jul. 13, 1999 (JP) .................................................. 11-199138

(51) Int. Cl.[7] ............................... B32B 3/00; B32B 31/20
(52) U.S. Cl. .......................... 428/209; 156/90; 156/286; 156/289; 156/293; 156/323
(58) Field of Search ............................... 156/90, 289, 323, 156/286, 293; 428/209

(56) References Cited

U.S. PATENT DOCUMENTS

| | | | |
|---|---|---|---|
| 4,680,075 | * 7/1987 | McNeal et al. | 156/289 |
| 4,737,208 | * 4/1988 | Bloechle et al. | 156/90 |
| 5,116,440 | * 5/1992 | Takeguchi et al. | 156/90 |
| 5,573,622 | * 11/1996 | Hass et al. | 156/289 |
| 5,626,713 | * 5/1997 | Yamaguchi et al. | 156/537 |

* cited by examiner

*Primary Examiner*—Cathy Lam
(74) *Attorney, Agent, or Firm*—McGinn & Gibb, PLLC

(57) ABSTRACT

The release member has a thermoplastic layer sandwiched between stripping films such that it flows toward the hole upon melting when it is heated under pressure and the stripping film in contact with the laminate has a breaking elongation of not less than 600% and a 100% elongation load of not more than 350 gf per unit width of 1 cm at the temperature to which the laminate is heated.

12 Claims, 3 Drawing Sheets

RELEASE MEMBER FOR USE IN PRODUCING A MULTI-LAYER PRINTED WIRING BOARD

BACKGROUND OF THE INVENTION

1. Field of the Invention

The present invention relates to a release member for use in the production of multi-layer printed wiring boards.

The present application is based on Japanese Patent Application No. Hei. 11-199138, which is incorporated herein by reference.

2. Description of the Related Art

Multi-layer printed wiring boards are manufactured by first laminating wiring boards with prepregs and other hot melt adhesive sheets being interposed and then pressing them under heat so that they are made integral by the adhesive sheets. If the wiring boards to be laminated have holes, part of the molten adhesive sheet will get into the holes to cause a certain inconvenience such as closure.

FIGS. 4A to 4C show steps in a conventional process for manufacturing a multi-layer printed wiring board. As shown in FIG. 4A, a copper foil 1" fitted with an adhesive film 13' and having a hole 14' is made integral with a wiring board 1' by bonding with the adhesive film 13'. Then, as shown in FIG. 4C, a predetermined conductor pattern is formed in the copper foil 1" and electrical continuity is established between the conductor pattern and an internal conductor line a' in the wiring board by means of copper plate b'. A problem with this process is that on account of the pressure and heat applied to make the copper foil integral with the wiring board, part of the molten adhesive film 13' sometimes gets into the hole 14' to break the conductor path.

In order to deal with this situation, it has been proposed that the perforated copper foil with an adhesive film be overlaid with a release member F' which, as shown in FIG. 4B, consists of a stripping film A' such as a fluoroplastic film, a thermoplastic resin layer C' such as a polyethylene layer, and a stripping film B'; when pressed under heating, the thermoplastic resin layer C' deforms to fill the hole 14' with the lower stripping film A' being at the bottom, thereby preventing the molten adhesive 13' from flowing into the hole 14'.

As the thermoplastic resin layer C' deforms, the lower stripping film A' develops resistance but this is extremely small since the depth of the hole 14' in the copper foil 1" is so small (10–50 μm) that the strain (elongation) of the film A' is virtually zero.

However, if the hole is several thousand micrometers deep, the release member has such a great resistance that the lower stripping film works very effectively to prevent the molten thermoplastic resin to flow into the hole, making it difficult for the resin to realize complete closure of the hole; as a result, complete prevention of the adhesive from getting into the hole becomes practically impossible.

Therefore, the conventional release member has been unsuitable for use in laminating an increased number of wiring boards and making them integral to produce a multi-layer printing wiring board having a deep IC chip accommodating cavity as shown in FIG. 2.

Another difficulty with the conventional release member is that gas evolves from the stripping film in contact with the side where holes are open, potentially causing a practical problem depending upon the structure of the multi-layer printed wiring board.

SUMMARY OF THE INVENTION

An object, therefore, of the present invention is to provide an improved release member for use in producing a multi-layer printed wiring board as a laminate by a process in which a plurality of substrates having internal conductor lines formed therein are laminated with a hot melt adhesive applied therebetween and the laminate in which the surface of the edge of each substrate adjacent a hole through the laminate serves as a wire bonding pad is heated under pressure so that the individual substrates are made integral by bonding with said hot melt adhesive. The release member can positively prevent the adhesive from getting into the hole even if it is very deep.

The stated object of the invention can be attained by a release member for use in producing a multi-layer printed wiring board as a laminate by a process in which a plurality of substrates having internal conductor lines formed therein are laminated with a hot melt adhesive applied therebetween and the laminate in which the surface of the edge of each substrate adjacent a hole through the laminate serves as a wire bonding pad is heated under pressure so that the individual substrates are made integral by bonding with said hot melt adhesive, said release member having a thermoplastic layer sandwiched between stripping films A and B such that it flows toward said hole upon melting when it is heated under pressure, the stripping film A in contact with said laminate having a breaking elongation of no less than 600% and a 100% elongation load of no more than 350 gf per unit width of 1 cm at the temperature to which said laminate is heated.

If desired, the release film A in contact with said laminate may consist of two or more elements, at least one of which has a breaking elongation of no less than 600% but all of them have a 100% elongation load of no more than 350 gf per unit width of 1 cm at the temperature to which said laminate is heated.

In a preferred embodiment, at least the stripping film A in contact with the laminate evolves gas in no more than 5 ppm at the temperature to which the laminate is heated.

In another preferred embodiment, at least the stripping film A in contact with the laminate is formed of a cast molded polytetrafluoroethylene film.

Features and advantages of the invention will be evident from the following detailed description of the preferred embodiments described in conjunction with the attached drawings.

DETAILED DESCRIPTION OF THE PREFERRED EMBODIMENTS

We now describe an embodiment of the invention with reference to accompanying drawings.

Figure 1:
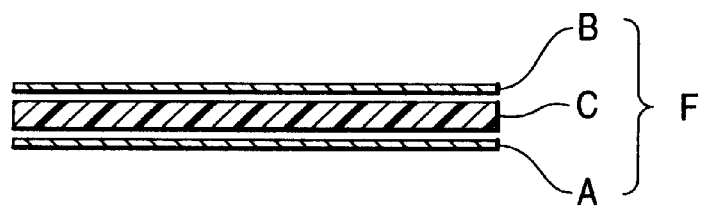
FIG. 1 illustrates an example of the release member of the invention.

FIG. 1 shows an example of the release member of the invention that is indicated by F. It consists of two stripping films A and B between which is held a layer of thermoplastic material C that flows to deform when heated at the temperature to be defined hereinafter. At least one of the two stripping films has a breaking elongation of not less than 600% and a 100% elongation load of not more than 350 gf per unit width of 1 cm at the temperature to which the release member is heated. The term "100% elongation load" means the load required to achieve 100% elongation. In FIG. 1, each stripping film is shown to have mere contact with the layer of thermoplastic material. If desired, they may be lightly fused together in certain areas.

Figure 2:
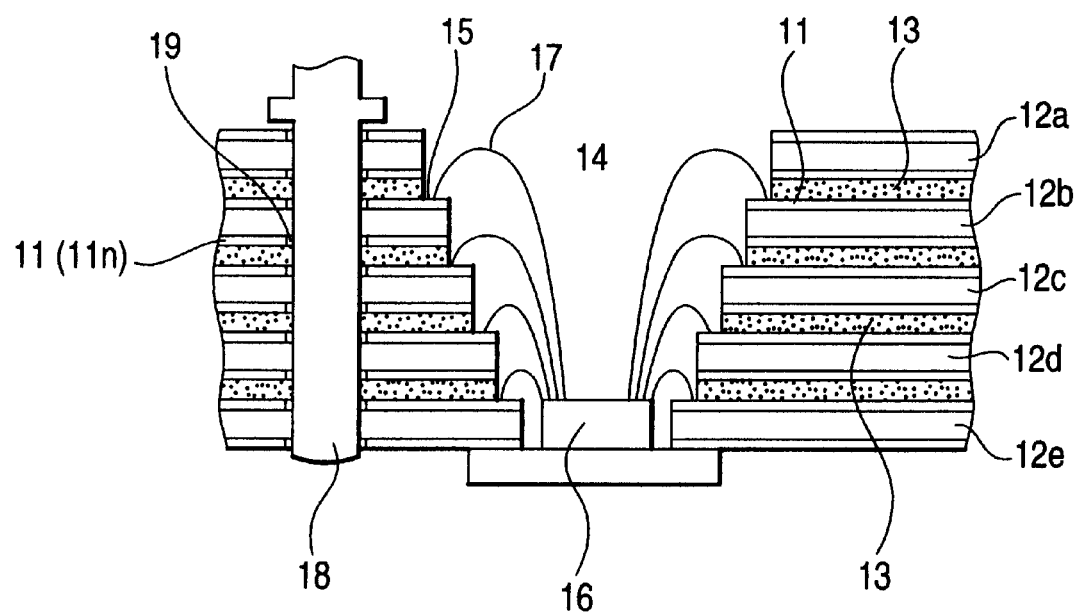
FIG. 2 is an example of a multi-layer printed wiring board that can be manufactured by laminating with the aid of the release member of the invention.

FIG. 2 shows an exemplary multi-layer printed wiring board that can be manufactured with the aid of the release member of the invention. Substrates 12a–12e each having an internal conductor line 11 formed on at least one side (in FIG. 2, the internal conductor line is formed on both sides of each substrate) are laminated and made integral with a hot melt adhesive 13. The laminate has a hole 14 of which the inside dimension decreases stepwise toward the bottom. A wire bonding pad 15 is provided on the surface of the edge of each substrate that is adjacent the hole 14. An IC chip 16 is placed on the bottom of the hole 14, with the electrodes on the IC chip 16 being connected to the respective pads 15 via bonding wires 17. An external lead pin 18 is passed through a via hole so that an internal conductor line (e.g., 11n) in a predetermined substrate is connected to the external circuit by means of solder 19.

Figure 3A:
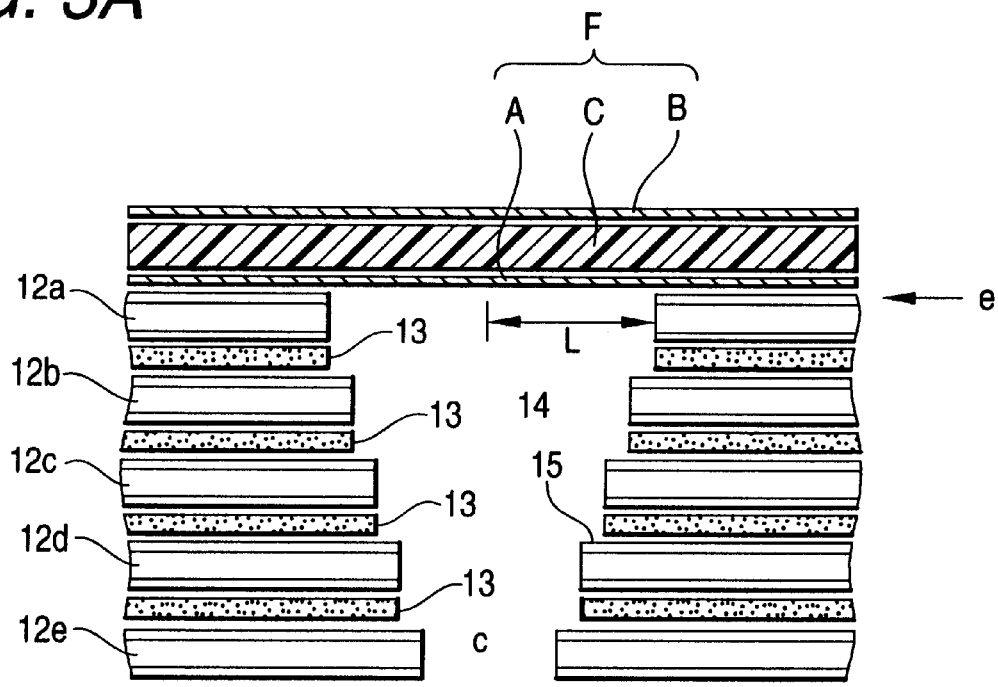
FIGS. 3A and 3B show how the release member of the invention is used in laminating printed wiring boards.
Figure 3B:
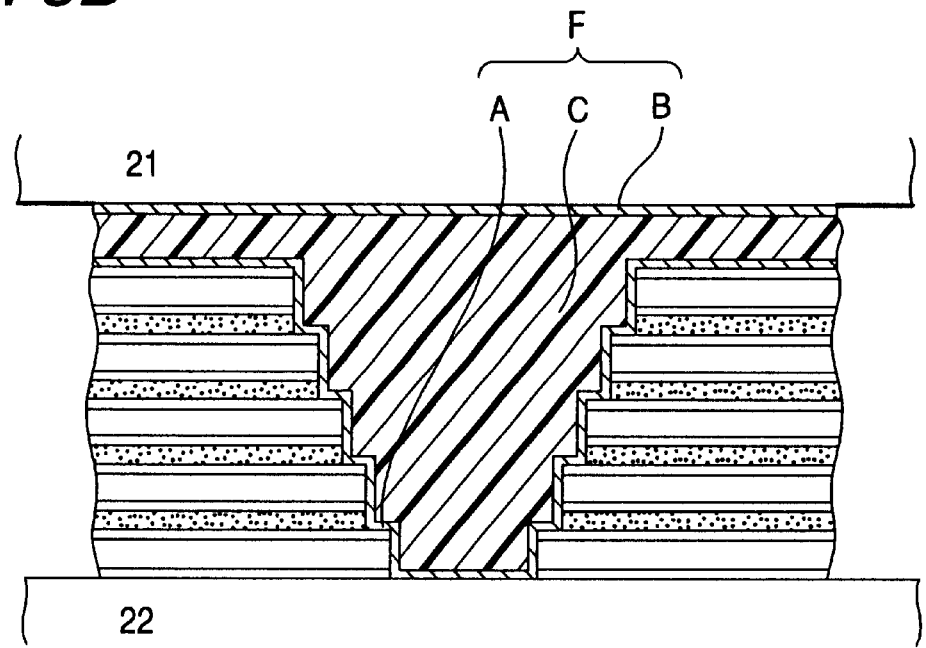
Figure 4A:
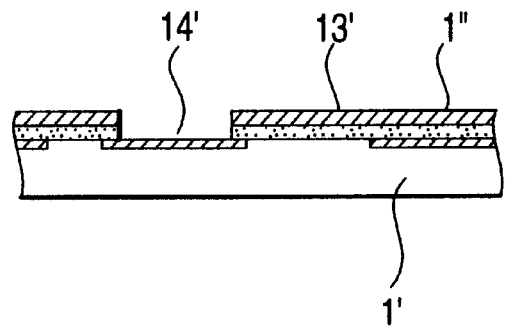
FIGS. 4A to 4C show steps in a conventional process for fabricating a multi-layer printed wiring board.
Figure 4B:
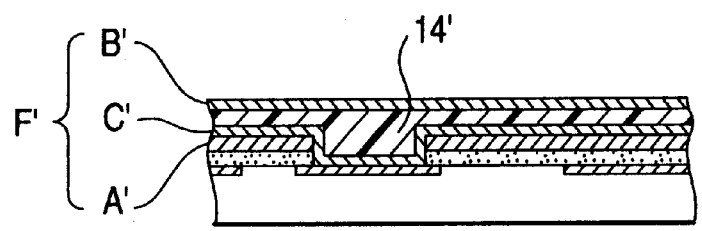
Figure 4C:
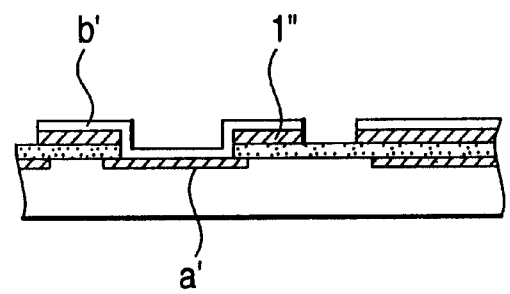

FIGS. 3A and 3B show steps in the process of laminating a plurality of wiring boards and making them integral to produce the multi-layer printed wiring board of FIG. 2 using the release member of FIG. 1.

First, as shown in FIG. 3A, printed wiring boards 12a–12e are placed one on another with heat fusible adhesive sheets 13 such as uncured epoxy resin sheets, uncured epoxy impregnated glass cloths or prepregs being interposed; the release member F is provided on the side of the laminate where the hole 14 opens with the greater dimension. Then, as shown in FIG. 3B, the laminate is held between molds 21 and 22 and pressed under heating.

As the pressing with heat continues, the adhesive sheets 13 melt and so does the thermoplastic material C in the release member F, which flows into the hole 14 under pressure. In this process, the stripping film A on the side of the laminate where the hole is open develops resistance to elongation. However, in accordance with the invention, the stripping film A is adapted to have a considerably low value of load to 100% elongation ($\leq 350$ gf per unit width of 1 cm), so the resistance of the stripping film A can be sufficiently reduced to ensure that the molten thermoplastic material C will flow toward the hole 14 smoothly and rapidly. If the larger dimension of the hole 14 from the center to the edge thereof is written as L and the distance from its top end e to the center of its bottom c is written as L+$\Delta$L, the percent elongation of the stripping film A can be approximated by $\Delta L \times 100/L$. Although this amounts to a considerably large value, the stripping film A which has a breaking elongation of at least 600% is effectively protected against rupture to ensure that the thermoplastic material C will in no case leak out of the release member F. Hence, before the molten adhesive 13 runs down the inner surface of the hole 14 under pressure, the stripping film A can be brought into intimate contact with the inner surface of the hole to ensure positive prevention of the adhesive 13 from getting into the hole while causing no leakage of the molten thermoplastic material C. As a result, the wire bonding pads remain contamination free and the individual wiring boards can be laminated and made integral as a multi-layer printed wiring board with the aid of the heat fusible adhesive sheets.

The stripping film A may consist of two or more elements. Thus, a plurality of elemental stripping films may be laminated and used instead of a single stripping film A. In this case, the requirement that the breaking elongation be not less than 600% at the temperature to which the release member is heated is desirably met by all elements of the stripping film A; however, this is not mandatory and said requirement may be satisfied by at least one element of the stripping film A. On the other hand, the requirement that the load to 100% elongation be not more than 350 gf per unit width of 1 cm at the same temperature must be satisfied by all elements of the film A since they cooperate in developing resistance to elongation.

When the release member F is heated to the temperature necessary for laminating and making integral the individual wiring boards to fabricate a multi-layer printed wiring board, gas may evolve from the stripping film A to foul the wire bonding pads and cause inconvenience in the wire bonding operation (though slight compared to the trouble caused by fouling with the adhesive). To deal with this difficulty, the stripping film A is preferably designed to evolve not more than 5 ppm, preferably not more than 3 ppm, of gas at the above-defined temperature. If the stripping film A consists of two or more elements, this requirement need be satisfied by all elements.

The laminate is usually compressed through two stages at a substantially constant pressure but at different temperatures. To give an example, the pressure is held constant at 50 kg/cm$^2$ and heating is done first at 130° C. for 30 minutes, then at 175° C. for 30 minutes. In this case, the breaking elongation and 100% elongation load are both measured at 130° C. whereas the evolution of gas is measured at 175° C.

The thermoplastic material C in the release member F of the invention may be of any type that melts and flows at the effective bonding temperature of the hot melt adhesive and, depending on this temperature, polyethylene, polypropylene, ethylene-vinyl acetate copolymer, poly (vinylidene chloride), silicone rubber and so forth may be used. The stripping film A may be of any type that is sufficiently heat-resistant to survive the bonding temperature of the hot melt adhesive and which satisfies both requirements for breaking elongation ($\geq 600\%$) and 100% elongation load ($\leq 350$ gf per unit width of 1 cm); examples that can be used include films of fluoroplastics such as poly(vinyl fluoride), poly(vinylidene fluoride) and tetrafluoroethylene-perfluoroalkyl vinyl ether copolymer and films of polymethylpentene resin; among these, ethylene-tetrafluoroethylene copolymer films, particularly, polytetrafluoroethylene films made by casting, are preferred since they evolve substantially no gas.

The stripping film B in the release member F is necessary to ensure that the molten thermoplastic material C will not stick to the inner surfaces of molds but it does not have to satisfy the above-mentioned requirements of the stripping film A (i.e., breaking elongation $\geq 600\%$; 100% elongation load $\leq 350$ gf per unit width of 1 cm). The stripping film B may be of any type that can maintain adequate mechanical strength at the effective bonding temperature of the hot melt adhesive; examples that can be used include not only the films listed for the stripping film A but also polyethylene terephthalate films, polypropylene films, poly(vinylidene chloride) films, poly(vinyl alcohol) films, polyacrylonitrile films, polyamide films and so forth, from among which a suitable film may be selected depending upon the bonding temperature of the hot melt adhesive.

To make polytetrafluoroethylene films by casting, the following procedure may be taken: a heat-resistant carrier, optionally coated with a mold release such as silicone, is coated with a dispersion of polytetrafluoroethylene and subjected to first-stage heating to remove the greater part of the solvent in the coated dispersion; then, the polytetrafluoroethylene coat is baked at a temperature higher than its melting point and the baked polytetrafluoroethylene film is stripped from the carrier sheet. This two-step heating process may be replaced by a one-step version. The carrier sheet may be selected from films of heat-resistant plastics such as polyimide, polyether ketone and polyether sulfone, and metal foils. The dispersion may be applied by various methods including dipping, spraying and brushing. For efficient coating operation, the solids content of the dispersion is typically in the range of 20–60 wt %, preferably 40–60%.

EXAMPLES

In the examples and comparative examples to be described below, a polyethylene film 300 μm thick (hereunder referred to as "film f0") was used as a thermoplastic material and the following stripping films were prepared.

[Film f1a]

A polytetrafluoroethylene dispersion having a solids content of 60 wt % was dip coated on a carrier sheet, heated at 90° C. for 2 minutes to remove the solvent and baked at 360° C. for 2 hours. This process was repeated three times and the baked film was stripped from the carrier sheet.

[Film f1b]

The same method was performed, except that the process consisting of dip coating, solvent removing and baking steps was repeated twice.

[Film f1']

The same method was performed, except that the process consisting of dip coating, solvent removing and baking steps was repeated five times.

[Film f2]

A molding powder of ethylene-tetrafluoroethylene copolymer was subjected to preliminary shaping on a cylindrical mold at 200 kgf/cm² for 1 hour, followed by heating at 380° C. for 3 hours to produce a cylindrical shape. The shape was cut to disks 45 □m thick on a lathe; the disks were placed in contact with a heated roll at 300° C. for 1 minute and stretched by 5% to remove strain.

[Film f2']

The procedure of making film f2 was repeated, except that the degree of stretching by contact with the heated roll at 300° C. for 1 minute was 15%.

[Film f3]

A polymethylpentene film 25 μm thick was used.

[Film f4]

Polytetrafluoroethylene pellets were extrusion molded into film from a T-die extruder at a die temperature of 340° C. with a lip gap of 400 μm at a speed of 5 m/min.

The thus prepared stripping films f1a–f4 were measured for the load to 100% elongation, breaking elongation and gas evolution. The results are shown in Table 1 below.

TABLE 1

| | 100% Elongation load (gf/1 cm wide) | | Breaking elongation (%) | | Gas evolution |
|---|---|---|---|---|---|
| | L | T | L | T | (ppm) |
| Film f1a | 330 | 320 | 770 | 750 | 3 |
| Film f1b | 160 | 150 | 770 | 750 | 2 |
| Film f1' | 370 | 380 | 820 | 760 | 3 |

TABLE 1-continued

| | 100% Elongation load (gf/1 cm wide) | | Breaking elongation (%) | | Gas evolution |
|---|---|---|---|---|---|
| | L | T | L | T | (ppm) |
| Film f2  | 310 | 270 | 640 | 750  | 0 |
| Film f2' | 330 | 240 | 520 | 760  | 0 |
| Film f3  | 170 | 70  | 610 | 1600 | 10 |
| Film f4  | 270 | 190 | 720 | 1120 | 32 |

* "L" means longitudinal direction and "T" means transverse direction.

The measurements were conducted by the following methods.

[Breaking Elongation L, %]

A No. 2 test piece according to JIS K7113 marked with a gage length F of 25 mm was pulled at a speed of 200 mm/min until it broke. The distance T (in mm) covered by the movement of the cross head to that point was measured. The breaking elongation of the test piece was calculated by L=T×100/F. The temperature for the measurement was 130° C.

[Load to 100% Elongation, gf/1 cm wide]

In accordance with JIS K7113, the load required for the cross head to move a distance of 25 mm was measured (gage length, 25 mm; pull speed, 200 mm/min) and the result was converted to a proportioned value for 1 cm. The temperature for the measurement was 130° C.

[Gas Evolution, ppm]

The amount of gas evolved at 175° C. for 10 minutes was determined by gas chromatography.

The thermoplastic film f0 and the stripping films f1a–f4 were used to prepare release members of the layer arrangements described below, in which the stripping film placed in contact with the side of a multi-layer printed wiring board where a hole was opened is within pointed brackets.

Using each of these release members and epoxy resin sheets (i.e., hot melt adhesives), five printed wiring boards (see FIG. 3) were laminated and made integral by two-step heating, first at 130° C. for 30 minutes, then at 175° C. for 30 minutes, with the pressure held constant at 50 kg/cm². This process was repeated to prepare fifty samples with each release member.

Example 1

The release member used in this example consisted of <film f1a>, film f0 and film f1a. The film f1a in contact with the side of the multi-layer printed wiring board where a hole was open satisfied the requirements for a breaking elongation of at least 600% and a 100% elongation load of not more than 350 gf/1 cm wide at the temperature of heating under press and, hence, in none of the 50 laminate samples the adhesive was found to run down the inner surface of the hole.

Example 2

The release member used in this example consisted of <film f2>, film f0 and film f1a. The film f2 in contact with the side of the multi-layer printed wiring board where a hole was open also satisfied the requirements for a breaking elongation of at least 600% and a 100% elongation load of not more than 350 gf/1 cm wide at the temperature of heating under press and, hence, in none of the 50 laminate samples the adhesive was found to run down the inner surface of the hole.

Example 3

The release member used in this example consisted of <film f1b>, film f0 and film f1a. The film f1b in contact with the side of the multi-layer printed wiring board where a hole was open also satisfied the requirements for a breaking elongation of at least 600% and a 100% elongation load of not ore than 350 gf/1 cm wide at the temperature of heating under press and, hence, in none of the 50 laminate samples the adhesive was found to run down the inner surface of the hole.

Example 4

The release member used in this example consisted of <film f3>, film f0 and film f1a. The film f3 in contact with the side of the multi-layer printed wiring board where a hole was open also satisfied the requirements for a breaking elongation of at least 600% and a 100% elongation load of not more than 350 gf/1 cm wide at the temperature of heating under press and, hence, in none of the 50 laminate samples the adhesive was found to run down the inner surface of the hole.

Example 5

The release member used in this example consisted of <film f4>, film f0 and film f1a. The film f4 in contact with the side of the multi-layer printed wiring board where a hole was open also satisfied the requirements for a breaking elongation of at least 600% and a 100% elongation load of not more than 350 gf/1 cm wide at the temperature of heating under press and, hence, in none of the 50 laminate samples the adhesive was found to run down the inner surface of the hole. Due to extensive gas evolution from the film f4, the bonding pads in 34 out of the 50 laminate samples were fouled by the deposition of decomposition gas but to a much smaller extent than contamination by the deposition of the adhesive.

Example 6

The release member used in this example consisted of <film f1b>, film f1b, film f0 and film f1a. With this layer arrangement, the result was the same as in Example 3.

Comparative Example 1

The release member used in this comparative example consisted of <film f1'>, film f0 and film f1a. In 10 out of the 50 laminate samples, the adhesive was found to run down the inner surface of the hole. This would be because the film f1' did not satisfy the requirement for a 100% elongation load of no more than 350 gf/1 cm wide but developed so high a resistance to elongation that the molten thermoplastic material (molten polyethylene) flowed only poorly.

Comparative Example 2

The release member used in this comparative example consisted of <film f2'>, film f0 and film f1a. In 13 out of the 50 laminate samples, the adhesive was found to run down the inner surface of the hole. This would be because the film f2' which did not satisfy the requirement for a breaking elongation of at least 600% ruptured while the laminate was pressed under heating.

According to the present invention, there is provided an improved release member for use in producing a multi-layer printed wiring board as a laminate by a process in which a plurality of substrates having internal conductor lines formed therein are laminated with a hot melt adhesive applied therebetween and the laminate in which the surface of the edge of each substrate adjacent a hole through the laminate serves as a wire bonding pad is heated under pressure so that the individual substrates are made integral by bonding with said hot melt adhesive. Even if an increased number of wiring boards are to be laminated to produce a deeper hole, the release member can positively prevent the adhesive from running down the inner surface of the hole; as a result, positive wire bonding is guaranteed and an even greater number of printed wiring boards can be laminated.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A release member for use in producing a multi-layer printed wiring board as a laminate, wherein the laminate comprises a plurality of substrates each having internal conductor lines and laminated with a hot melt adhesive applied between each layer, and the laminated wiring board has a hole penetrating the laminated substrates, said release member comprising:

a first stripping film in contact with the laminate;

a second stripping film; and a thermoplastic layer sandwiched between said first stripping film and said second stripping film, said thermoplastic layer flowing into the hole together with said first stripping film upon melting when it is heated under pressure, wherein, at a temperature at which the laminate is heated, said first stripping, film has a breaking elongation of not less than 600% and a 100% elongation load of not more than 350 gf per unit width of 1 cm.

2. A release member according to claim 1, wherein said first stripping film evolves gas in not more than 5 ppm at the temperature to which the laminate is heated.

3. A release member according to claim 1, wherein said first stripping film is formed of a cast molded polytetrafluoroethylene film.

4. The release member of claim 1, wherein said thermoplastic layer is selected from the group consisting of polyethylene, polypropylene, ethylene-vinyl acetate copolymer, poly(vinylidene chloride) and silicone rubber.

5. The release member of claim 1, wherein said first stripping film is selected from the group consisting of poly(vinyl fluoride), poly(vinylidene fluoride), poly (tetrafluoro ethylene), ethylene-tetrafluoroethylene copolymer and poly(methylenepentene).

6. A release member for use in producing a multi-layer printed wiring board as a laminate, wherein the laminate comprises a plurality of substrates each having internal conductor lines and laminated with a hot melt adhesive applied between each layer, and the laminate has a hole penetrating the laminated substrates, said release member comprising:

a first stripping film comprising a plurality of laminated elemental films, one of said elemental films being in contact with the laminate;

a second stripping film; and a thermoplastic layer sandwiched between said first stripping film and said second stripping film, said thermoplastic layer flowing into the hole together with said first stripping film upon melting when it is heated under pressure, wherein, at a temperature at which the laminate is prepared, at least one of said elemental films has a breaking elongation of not less than 600% and a 100% elongation load of not more than 350 gf per unit width of 1 cm.

7. A release member according to claim 6, wherein said first stripping film evolves gas in not more than 5 ppm at the temperature to which the laminate is heated.

8. A release member according to claim 6, wherein aid first stripping film is formed of a cast molded polytetrafluoroethylene film.

9. The release member of claim 6, wherein said thermoplastic layer is selected from the group consisting of polyethylene, polypropylene, ethylene-vinyl acetate copolymer, poly(vinylidene chloride) and silicone rubber.

10. The release member of claim 6, wherein said first stripping film is selected from the group consisting of poly(vinyl fluoride), poly(vinylidene fluoride), poly(tetrafluoro ethylene), ethylene-tetrafluoroethylene copolymer and poly(methylenepentene).

11. A release member for laminating a multi-layered printed wiring board comprising a first stripping film;

a second stripping film; and a thermoplastic layer sandwiched between said first stripping film and said second stripping film, wherein said first stripping film comprises cast poly(tetrafluoroethylene (PTFE)) prepared by a process comprising:

preparing a dispersion of 20–60 weight percent PTFE;

coating a heat resistant carrier with said dispersion and heating to remove a solvent;

baking the coated carrier at a temperature above the melting point of PTFE; and stripping the PTFE film from the carrier.

12. The release member of claim 11 wherein said carrier is selected from the group consisting of polyimide, polyether ketone, polyether sulfone and metal foils.

* * * * *